United States Patent
Bouvier et al.

(10) Patent No.: US 10,211,365 B2
(45) Date of Patent: Feb. 19, 2019

(54) METHOD FOR PRODUCING OPTOELECTRONIC DEVICES COMPRISING LIGHT-EMITTING DIODES

(71) Applicants: Commissariat à l'Énergie Atomique et aux Énergies Alternatives, Paris (FR); Aledia, Grenoble (FR)

(72) Inventors: Christophe Bouvier, Grenoble (FR); Emilie Pougeoise, Grenoble (FR); Xavier Hugon, Teche (FR); Carlo Cagli, Grenoble (FR); Tiphaine Dupont, Grenoble (FR); Philippe Gibert, Saint-Etienne-de-Crossey (FR); Nacer Aitmani, Egreve (FR)

(73) Assignees: Commissariat à l'Énergie Atomique et aux Énergies Alternatives, Paris (FR); Aledia, Grenoble (FR)

( * ) Notice: Subject to any disclaimer, the term of this patent is extended or adjusted under 35 U.S.C. 154(b) by 0 days.

(21) Appl. No.: 14/916,985

(22) PCT Filed: Sep. 30, 2014

(86) PCT No.: PCT/FR2014/052472
§ 371 (c)(1),
(2) Date: Mar. 4, 2016

(87) PCT Pub. No.: WO2015/044620
PCT Pub. Date: Apr. 2, 2015

(65) Prior Publication Data
US 2016/0218240 A1    Jul. 28, 2016

(30) Foreign Application Priority Data
Sep. 30, 2013   (FR) .................... 13 59413

(51) Int. Cl.
*H01L 33/00* (2010.01)
*H01L 33/18* (2010.01)
(Continued)

(52) U.S. Cl.
CPC ........ *H01L 33/0095* (2013.01); *H01L 33/005* (2013.01); *H01L 33/18* (2013.01);
(Continued)

(58) Field of Classification Search
CPC ......... G02B 6/42; H01L 27/288; H01L 33/00; H01L 33/08; H01L 33/18; H01L 33/62
See application file for complete search history.

(56) References Cited

U.S. PATENT DOCUMENTS

2003/0013217 A1    1/2003  Dudoff et al.
2005/0189474 A1*   9/2005  Tomioka ............... H01L 25/167
                                                       250/214.1
(Continued)

FOREIGN PATENT DOCUMENTS

WO    WO 03/012884 A1    2/2003
WO    WO 2013/080174 A1  6/2012

OTHER PUBLICATIONS

Written Opinion, dated Dec. 11, 2014, from corresponding International Application No. PCT/FR2014/052472.
(Continued)

*Primary Examiner* — Mohammad Choudhry
(74) *Attorney, Agent, or Firm* — Wolf, Greenfield & Sacks, P.C.

(57) ABSTRACT

A method for producing optoelectronic devices, including the following successive steps: providing a substrate having a first face; on the first face, forming sets of light-emitting diodes including wire-like, conical or frustoconical semiconductor elements; covering all of the first face with a layer encapsulating the light-emitting diodes; forming a conduc-
(Continued)

tive element that is insulated from the substrate and extends through the substrate from the second face to at least the first face; reducing the thickness of the substrate; and cutting the resulting structure in order to separate each set of light-emitting diodes.

12 Claims, 9 Drawing Sheets

(51) Int. Cl.
  *H01L 33/62*   (2010.01)
  *H01L 33/50*   (2010.01)
  *H01L 33/54*   (2010.01)
  *H01L 33/08*   (2010.01)
  *H01L 33/38*   (2010.01)
  *H01L 25/075*   (2006.01)

(52) U.S. Cl.
  CPC ............ H01L 33/507 (2013.01); H01L 33/54 (2013.01); H01L 33/62 (2013.01); *H01L 25/0753* (2013.01); *H01L 33/08* (2013.01); *H01L 33/382* (2013.01); *H01L 33/385* (2013.01); *H01L 2924/0002* (2013.01); *H01L 2933/005* (2013.01); *H01L 2933/0016* (2013.01); *H01L 2933/0041* (2013.01); *H01L 2933/0066* (2013.01)

(56) References Cited

U.S. PATENT DOCUMENTS

| | | | |
|---|---|---|---|
| 2009/0065800 A1 | 3/2009 | Wirth et al. | |
| 2010/0163891 A1* | 7/2010 | Ku | F21S 10/02 257/88 |
| 2011/0198646 A1* | 8/2011 | Wu | H01L 33/60 257/98 |
| 2011/0291145 A1 | 12/2011 | Han et al. | |
| 2012/0181568 A1 | 7/2012 | Hsia et al. | |
| 2013/0183836 A1 | 7/2013 | Kim et al. | |

OTHER PUBLICATIONS

International Search Report, dated Dec. 11, 2014, from corresponding International Application No. PCT/FR2014/052472.

* cited by examiner

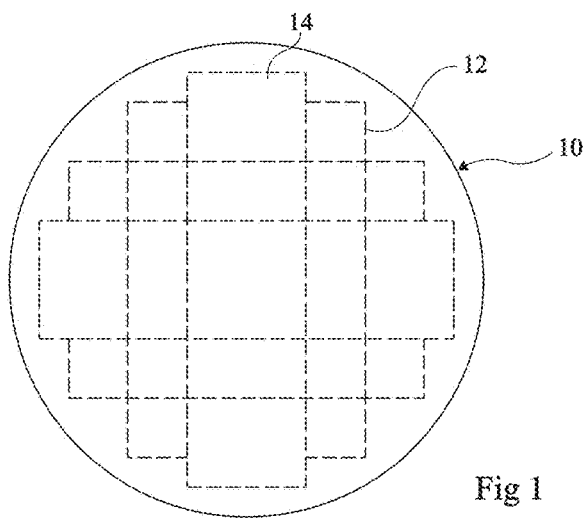
Fig 1
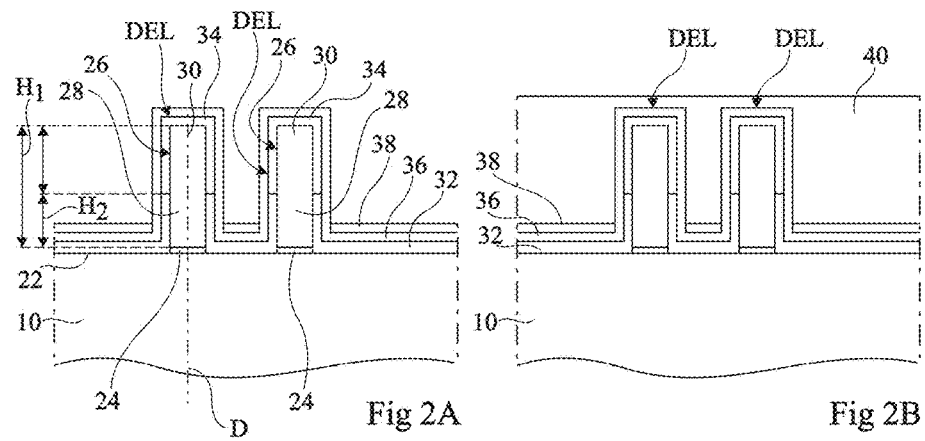
Fig 2A
Fig 2B
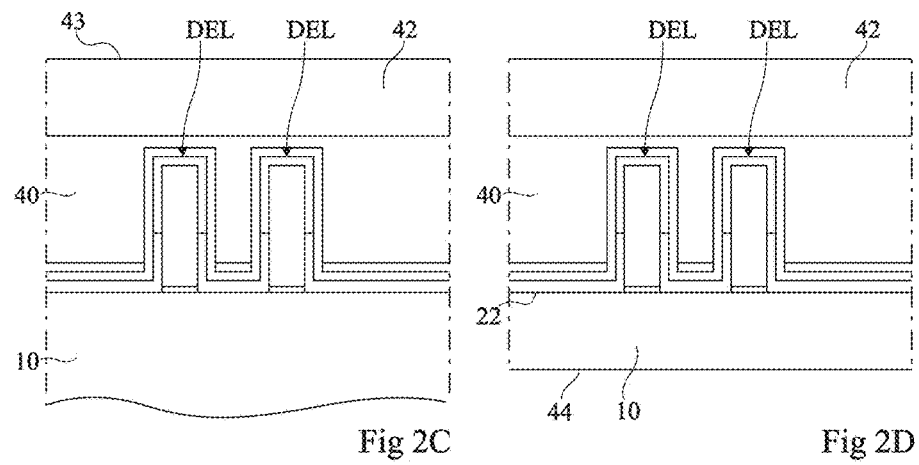
Fig 2C
Fig 2D

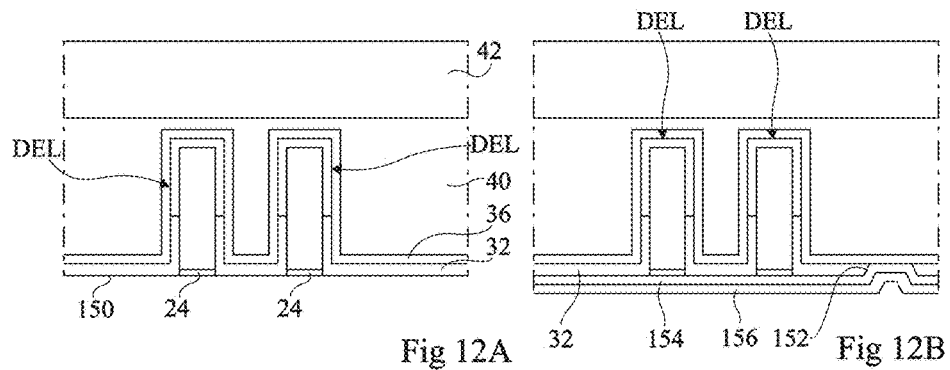
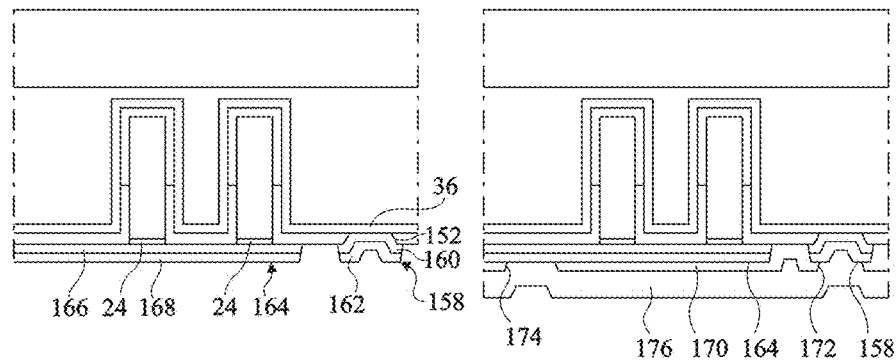
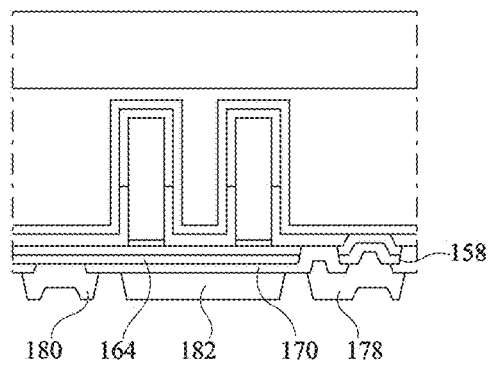

METHOD FOR PRODUCING OPTOELECTRONIC DEVICES COMPRISING LIGHT-EMITTING DIODES

CROSS-REFERENCE TO RELATED APPLICATIONS

This application is the national phase of International Application No. PCT/FR2014/052472, titled, filed on Sep. 30, 2014, which claims the priority benefit of French Application No. 13/59413, filed on Sep. 30, 2013, which applications are hereby incorporated by reference to the maximum extent allowable by law.

BACKGROUND

The present invention generally relates to methods of manufacturing optoelectronic devices based on semiconductor materials. The present invention more specifically relates to methods of manufacturing optoelectronic devices comprising light-emitting diodes formed by three-dimensional elements, particularly semiconductor microwires or nanowires.

DISCUSSION OF THE RELATED ART

The term "optoelectronic devices with light-emitting diodes" designates devices capable of converting an electric signal into an electromagnetic radiation, and particularly devices dedicated to emitting an electromagnetic radiation, particularly light. Examples of three-dimensional elements capable of forming light-emitting diodes are microwires or nanowires comprising a semiconductor material based on a compound mainly comprising at least one group-III element and one group-V element (for example, gallium nitride GaN), called III-V compound hereafter, or mainly comprising at least one group-II element and one group-VI element (for example, zinc oxide ZnO), called II-VI compound hereafter.

The three-dimensional elements, particularly semiconductor microwires or nanowires, are generally formed on a substrate which is then sawn to delimit individual optoelectronic devices. Each optoelectronic device is then arranged in a package, particularly to protect the three-dimensional elements. The package may be attached to a support, for example, a printed circuit.

A disadvantage of such an optoelectronic device manufacturing method is that the steps of protecting the three-dimensional semiconductor elements have to be performed separately for each optoelectronic device. Further, the bulk of the package may be significant as compared with the active area of the optoelectronic device comprising the light-emitting diodes.

SUMMARY

Thus, an object of an embodiment is to at least partly overcome the disadvantages of previously-described optoelectronic devices comprising light-emitting diodes, particularly with microwires or nanowires.

Another object of an embodiment is to suppress the individual protection packages of optoelectronic devices comprising light-emitting diodes.

Another object of an embodiment is for optoelectronic devices comprising light-emitting diodes made of semiconductor material to be capable of being manufactured at an industrial scale and at a low cost.

Thus, an embodiment provides a method of manufacturing optoelectronic devices comprising the successive steps of:

(a) providing a substrate comprising a first surface;
(b) forming, on the first surface, assemblies of light-emitting diodes comprising, conical or tapered wire-shaped semiconductor elements;
(c) forming, for each assembly of light-emitting diodes, an electrode layer covering each light-emitting diode of said assembly and a conductive layer covering the electrode layer around the light-emitting diodes of said assembly;
(d) covering the entire first surface of a layer encapsulating the light-emitting diodes;
(e) decreasing the substrate thickness, the substrate comprising, after step (e), a second surface opposite to the first surface;
(f) forming a conductive element insulated from the substrate and crossing the substrate from the second surface all the way to at least the first surface, the conductive element being in contact with the conductive layer;
(g) forming, on the second surface, at least one first conductive pad in contact with the substrate; and
(h) cutting the obtained structure to separate each assembly of light-emitting diodes.

According to an embodiment, the method comprises, at step (f), forming, on the second surface, at least one second conductive pad in contact with the conductive element.

According to an embodiment, the method comprises forming at least one additional conductive element, insulated from the substrate and crossing the substrate from the second surface all the way to at least the first surface, and in contact with the base of at least one of the light-emitting diodes.

According to an embodiment, the forming of the conductive element successively comprises, after step (e), etching an opening in the substrate from the second surface, forming an insulating layer at least on the lateral walls of the opening, and forming a conductive layer covering the insulating layer, or filling the opening with a conductive material.

According to an embodiment, the forming of the conductive element comprises, before step (b), etching an opening in the substrate from the first surface across a portion of the substrate thickness, the opening being opened on the second surface after the substrate thinning step.

According to an embodiment, the electrode layer and the conductive layer are further formed in the opening.

According to an embodiment, the method comprises, before step (b), forming an insulating portion at least on the lateral walls of the opening and filling the opening with a conductive material.

According to an embodiment, at step (e), the substrate is totally removed.

According to an embodiment, the method further comprises, for each assembly of light-emitting diodes, depositing at least one conductive layer in contact with the bases of the diodes of said assembly.

According to an embodiment, the method comprises, before step (e), a step of attaching a support to the layer encapsulating the light-emitting diodes.

According to an embodiment, the layer encapsulating the light-emitting diodes comprises phosphors between the light-emitting diodes.

According to an embodiment, the method comprises a step of forming a layer of phosphors covering the layer encapsulating the light-emitting diodes or covering the support.

According to an embodiment, the method comprises a step of forming a layer, between the layer encapsulating the light-emitting diodes and the phosphor layer, capable of transmitting the light rays emitted by the light-emitting diodes and of reflecting the light rays emitted by the phosphors.

According to an embodiment, the method comprises a step of forming reflectors around the light-emitting diodes between the substrate and the layer encapsulating the light-emitting diodes and having a height greater by 50% than the height of the light-emitting diodes.

BRIEF DESCRIPTION OF THE DRAWINGS

The foregoing and other features and advantages will be discussed in detail in the following non-limiting description of specific embodiments in connection with the accompanying drawings, among which:

FIG. 1 is a partial simplified top view of an example of a semiconductor substrate wafer having a plurality of optoelectronic devices comprising microwires or nanowires formed thereon;

FIGS. 2A to 2F are partial simplified cross-section views of structures obtained at successive steps of an embodiment of a method of manufacturing optoelectronic devices comprising microwires or nanowires;

FIGS. 12A to 12E are partial simplified cross-section views of structures obtained at successive steps of another embodiment of a method of manufacturing optoelectronic devices comprising microwires or nanowires;

DETAILED DESCRIPTION

Figure 2E:
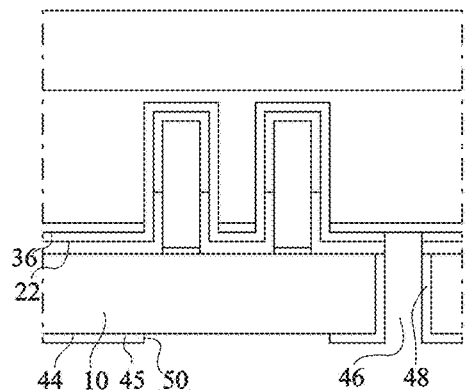

For clarity, the same elements have been designated with the same reference numerals in the various drawings and, further, as usual in the representation of electronic circuits, the various drawings are not to scale. Further, only those elements which are useful to the understanding of the present description have been shown and will be described. In particular, the optoelectronic device control means described hereafter are within the abilities of those skilled in the art and are not described.

In the following description, unless otherwise indicated, the terms "substantially", "approximately", and "in the order of" mean "to within 10%". Further, "compound mainly formed of a material" or "compound based on a material" means that a compound comprises a proportion greater than or equal to 95% of said material, this proportion being preferentially greater than 99%.

The present description relates to optoelectronic devices comprising three-dimensional elements, for example, microwires, nanowires, conical elements, or tapered elements. In the following description, embodiments are described for optoelectronic devices comprising microwires or nanowires. However, these embodiments may be implemented for three-dimensional elements other than microwires or nanowires, for example, pyramid-shaped three-dimensional elements.

The term "microwire" or "nanowire" designates a three-dimensional structure having an elongated shape along a preferential direction, having at least two dimensions, called minor dimensions, in the range from 5 nm to 2.5 µm, preferably from 50 nm to 2.5 µm, the third dimension, called major dimension, being at least equal to 1 time, preferably at least 5 times, and more preferably still at least 10 times, the largest of the minor dimensions. In certain embodiments, the minor dimensions may be smaller than or equal to approximately 1 µm, preferably in the range from 100 nm to 1 µm, more preferably from 100 nm to 300 nm. In certain embodiments, the height of each microwire or nanowire may be greater than or equal to 500 nm, preferably in the range from 1 µm to 50 µm.

In the following description, the term "wire" is used to mean "microwire or nanowire". Preferably, the average line of the wire which runs through the centers of gravity of the cross-sections, in planes perpendicular to the preferential direction of the wire, is substantially rectilinear and is called "axis" of the wire hereafter.

FIG. 1 is a partial simplified top view of a wafer 10 of a semiconductor substrate having wires formed thereon. As an example, it is a single-crystal silicon wafer having an initial thickness in the range from 500 µm to 1,500 µm, for example, approximately 725 µm, and having a diameter in the range from 100 mm to 300 mm, for example, approximately 200 mm. Advantageously, it is a silicon wafer currently used in methods of circuit manufacturing in microelectronics, particularly based on metal-oxide field-effect transistors or MOS transistors. As a variation, any other single-crystal semiconductor compatible with microelectronics manufacturing methods such as germanium may be used. Preferably, the semiconductor substrate is doped to decrease the electric resistivity of the substrate to an acceptable level for the series resistance of the light-emitting diode and to a resistivity close to that of metals, preferably smaller than a few mohm·cm.

A plurality of optoelectronic devices 14 comprising light-emitting diodes are simultaneously formed on wafer 10. Dotted lines 12 show an example of separation limits between optoelectronic devices 14. The number of light-emitting diodes may be different according to optoelectronic devices 14. Optoelectronic devices 14 may take up portions of wafer 10 having different surface areas. Optoelectronic devices 14 are separated by steps of sawing wafer 10 along sawing paths shown by lines 12.

According to an embodiment, the method of manufacturing optoelectronic devices 14 comprising light-emitting diodes formed of three-dimensional elements, particularly semiconductor wires, comprises the steps of:

forming the light-emitting diodes of the optoelectronic devices on a first surface of wafer 10;

protecting the assembly of light-emitting diodes with an encapsulation layer;

forming contact pads for the biasing of the light-emitting diodes for each optoelectronic device on the side opposite to the encapsulation layer; and sawing wafer 10 to separate the optoelectronic devices.

The encapsulation layer protects the light-emitting diodes during the contact pad forming steps and is kept after the optoelectronic devices have been separated. The encapsulation layer keeps on protecting the light-emitting diodes after the substrate has been sawn. It is then not necessary to provide, for each optoelectronic device, a protection package for the light-emitting diodes, attached to the device after the optoelectronic devices have been separated. The bulk of the optoelectronic device may be decreased.

Further, the step of protecting the light-emitting diodes of optoelectronic devices 14 is carried out by encapsulation of the wires in an encapsulation layer which is deposited all over wafer 10 before the step of sawing wafer 10. This step is thus carried out only once, for the all the optoelectronic devices 14 formed on wafer 10. The manufacturing cost of each optoelectronic device is thus decreased.

Thus, the encapsulation is entirely performed at the wafer scale after the microwire or nanowire manufacturing steps. Such a collective encapsulation at the wafer scale enables to decrease the number of steps dedicated to the encapsulation, and thus the encapsulation cost. Further, the surface area of the final encapsulated optoelectronic component is almost identical to that of the active area of the chip taking part in the light emission, which enables to decrease the dimensions of the optoelectronic component.

FIGS. 2A to 2F are partial simplified cross-section views of obtained structures corresponding to an optoelectronic device at successive steps of an embodiment of a method of manufacturing optoelectronic devices formed with wires such as previously described and capable of emitting an electromagnetic radiation. FIGS. 2A to 2F correspond to one of the optoelectronic devices formed on substrate 10.

FIG. 2A shows a structure comprising, from bottom to top in FIG. 2A:

semiconductor substrate 10 comprising an upper surface 22;

seed pads 24 promoting the growth of wires and arranged on surface 22;

wires 26 (two wires being shown) of height H1, each wire 26 being in contact with one of seed pads 24, each wire 26 comprising a lower portion 28, of height H2, in contact with seed pad 24 and an upper portion 30, of height H3, continuing lower portion 28;

an insulating layer 32 extending on surface 22 of substrate 10 and on the lateral sides of lower portion 28 of each wire 26;

a shell 34 comprising a stack of semiconductor layers covering each upper portion 30;

a layer 36 forming a first electrode covering each shell 30 and further extending on insulating layer 32; and a conductive layer 38 covering electrode layer 36 between wires 26 without extending on wires 26.

The assembly formed by each wire 26, the associated seed pad 24, and shell 34 forms a light-emitting diode DEL. The base of diode DEL corresponds to seed pad 24. Shell 34 particularly comprises an active layer which is the layer from which most of the electromagnetic radiation delivered by light-emitting diode DEL is emitted.

Substrate 10 may correspond to a one-piece structure or correspond to a layer covering a support made of another material. Substrate 10 for example is a semiconductor substrate, preferably a semiconductor substrate compatible with manufacturing methods implemented in microelectronics, for example, a substrate made of silicon, germanium, or an alloy of these compounds. The substrate is doped so that the substrate resistivity is lower than a few mohm·cm.

Preferably, substrate 10 is a semiconductor substrate, such as a silicon substrate. Substrate 10 may be doped with a first conductivity type, for example, N-type doped. Surface 22 of substrate 20 may be a<100> surface.

Seed pads 24, also called seed islands, are made of a material promoting the growth of wires 26. As a variation, seed pads 24 may be replaced with a seed layer covering surface 22 of substrate 10. In the case of seed pads, a treatment may further be provided to protect the lateral edges of the seed pads and the surface of the substrate portions which are not covered with the seed pads to prevent wires from growing on the lateral sides of the seed pads and on the surface of the substrate portions which are not covered with the seed pads. The treatment may comprise forming a dielectric region on the lateral sides of the seed pads and extending on top of and/or inside of the substrate and connecting, for each pair of pads, one of the pads of the pair to the other pad in the pair, with no wire growth on the dielectric region.

As an example, the material forming seed pads 24 may be a nitride, a carbide, or a boride of a transition metal from column IV, V, or VI of the periodic table of elements or a combination of these compounds. As an example, seed pads 24 may be made of aluminum nitride (AlN), boron (B), boron nitride (BN), titanium (Ti), titanium nitride (TiN), tantalum (Ta), tantalum nitride (TaN), hafnium (Hf), hafnium nitride (HfN), niobium (Nb), niobium nitride (NbN), zirconium (Zr), zirconium borate (ZrB2), zirconium nitride (ZrN), silicon carbide (SiC), tantalum carbo-nitride (TaCN), magnesium nitride in MgxNy form, where x is approximately equal to 3 and y is approximately equal to 2, for example, magnesium nitride in Mg3N2 form or magnesium gallium nitride (MgGaN), tungsten (W), tungsten nitride (WN), or a combination thereof.

Seed pads 24 may be doped with the same conductivity type as substrate 10 or with the opposite conductivity type.

Insulating layer 32 may be made of a dielectric material, for example, silicon oxide ($SiO_2$), silicon nitride ($Si_xN_y$, where x is approximately equal to 3 and y is approximately equal to 4, for example, $Si_3N_4$), aluminum oxide ($Al_2O_3$), hafnium oxide ($HfO_2$), or diamond. As an example, the thickness of insulating layer 32 is in the range from 5 nm to 800 nm, for example, equal to approximately 30 nm.

Wires 26 may be at least partly formed based on at least one semiconductor material. The semiconductor material may be silicon, germanium, silicon carbide, a III-V compound, a II-VI compound, or a combination of these compounds.

Wires 26 may be at least partly formed of semiconductor materials mainly comprising a III-V compound, for example, III-N compounds. Examples of group-III elements comprise gallium (Ga), indium (In), or aluminum (Al). Examples of III-N compounds are GaN, AN, InN, InGaN, AlGaN, or AlInGaN. Other group-V elements may also be used, for example, phosphorus or arsenic. Generally, the elements in the III-V compound may be combined with different molar fractions.

Wires 26 may be at least partly formed based on semiconductor materials mainly comprising a II-VI compound. Examples of group-II elements comprise group-IIA elements, particularly beryllium (Be) and magnesium (Mg), and group-IIB elements, particularly zinc (Zn) and cadmium (Cd). Examples of group—VI elements comprise group-VIA elements, particularly oxygen (O) and tellurium (Te). Examples of II-VI compounds are ZnO, ZnMgO, CdZnO, or CdZnMgO. Generally, the elements in the II-VI compound may be combined with different molar fractions.

Wires 26 may comprise a dopant. As an example, for III-V compounds, the dopant may be selected from the group comprising a group-II P-type dopant, for example, magnesium (Mg), zinc (Zn), cadmium (Cd), or mercury (Hg), a group-IV P-type dopant, for example, carbon (C), or a group-IV N-type dopant, for example, silicon (Si), germanium (Ge), selenium (Se), sulfur (S), terbium (Tb), or tin (Sn).

The cross-section of wires 26 may have different shapes, such as, for example, oval, circular, or polygonal, particularly triangular, rectangular, square, or hexagonal. It should thus be understood that the term "diameter" mentioned in relation with a cross-section of a wire or of a layer deposited on this wire designates a quantity associated with the surface area of the targeted structure in this cross-section, corresponding, for example, to the diameter of the disk having the same surface area as the wire cross-section. The average diameter of each wire 26 may be in the range from 50 nm to 2.5 µm. Height H1 of each wire 26 may be in the range from 250 nm to 50 µm.

Each wire 26 may have an elongated semiconductor structure along an axis D substantially perpendicular to surface 22. Each wire 26 may have a general cylindrical shape.

The axes of two wires 26 may be distant by from 0.5 µm to 10 µm, and preferably from 1.5 µm to 4 µm. As an example, wires 26 may be regularly distributed. As an example, wires 26 may be distributed in a hexagonal network.

As an example, lower portion 28 of each wire 26 is mainly formed of the III-N compound, for example, gallium nitride, having a doping of the first conductivity type, for example, silicon. Lower portion 28 extends up to a height H2 which may be in the range from 100 nm to 25 µm.

As an example, upper portion 30 of each wire 26 is at least partially made of a III-N compound, for example, GaN. Upper portion 30 may be doped with the first conductivity type, or may not be intentionally doped. Upper portion 30 extends up to a height H3 which may be in the range from 100 nm to 25 µm.

In the case of a wire 26 mainly made of GaN, the crystal structure of wire 26 may be of wurtzite type, the wire extending along axis C. The crystal structure of wire 26 may also be of cubic type.

Shell 34 may comprise a stack of an active layer covering upper portion 30 of the associated wire 26 and of a bonding layer between the active layer and electrode 36.

The active layer is the layer from which most of the radiation delivered by light-emitting diode DEL is emitted. According to an example, the active layer may comprise confinement means, such as multiple quantum wells. It is for example formed of an alternation of GaN and of InGaN layers having respective thicknesses from 5 to 20 nm (for example, 8 nm) and from 1 to 10 nm (for example, 2.5 nm). The GaN layers may be doped, for example of type N or P. According to another example, the active layer may comprise a single InGaN layer, for example, having a thickness greater than 10 nm.

The bonding layer may correspond to a semiconductor layer or to the stack of semiconductor layers and enables to form a P-N or P-I-N junction with the active layer andor upper portion 30. It enables to inject holes into the active layer via electrode 36. The stack of semiconductor layers may comprise an electron barrier layer made of a ternary alloy, for example, aluminum gallium nitride (AlGaN) or aluminum indium nitride (AlInN) in contact with the active layer and an additional layer, to provide a good electric contact between electrode 36 and the active layer, for example, made of gallium nitride (GaN) in contact with the electron barrier layer and with electrode 36. The bonding layer may be doped with the conductivity type opposite to that of portion 30, for example, P-type doped.

Electrode 36 is capable of biasing the active layer of each wire 26 and of letting through the electromagnetic radiation emitted by light-emitting diodes DEL. The material forming electrode 36 may be a transparent and conductive material such as indium tin oxide (ITO), aluminum zinc oxide, or graphene. As an example, electrode 36 has a thickness in the range from 10 nm to 150 nm according to the desired emission wavelength.

Conductive layer 38 may be a single layer or correspond to a stack of two layers or of more than two layers. Conductive layer 38 may further be capable of at least partly reflecting the radiation emitted by light-emitting diodes DEL. As an example, conductive layer 38 corresponds to a metal monolayer. According to another example, conductive layer 38 corresponds to a stack of layers for example comprising a metal layer covered with a dielectric layer or with a plurality of dielectric layers. The metal layer of conductive layer 38 may be formed on a bonding layer, for example, made of titanium. As an example, the material forming the metal layer of conductive layer 38 (monolayer or multilayer) may be aluminum, an alloy based on aluminum, particularly AlSiz, AlxCuy (for example, with x equal to 1 and y equal to 0.8%), silver, gold, nickel, chromium, rhodium, ruthenium, palladium, or an alloy of two of these compounds or of more than two of these compounds. As an example, conductive layer 38 (monolayer or multilayer) has a thickness in the range from 100 nm to 2,000 nm.

An embodiment of a manufacturing method providing the structure shown in FIG. 2A comprises the steps of:

(1) Forming, on surface 22 of substrate 10, seed pads 24.

Seed pads 24 may be obtained by a method such as chemical vapor deposition (CVD) or metal-organic chemical vapor deposition (MOCVD), also known as metal-organic vapor phase epitaxy (MOVPE). However, methods such as molecular-beam epitaxy (MBE), gas-source MBE (GSMBE), metal-organic MBE (MOMBE), plasma-assisted MBE (PAMBE), atomic layer epitaxy (ALE), hydride vapor phase epitaxy (HVPE) may be used, as well as an atomic layer deposition (ALD). Further, methods such as evaporation or reactive cathode sputtering may be used.

When seed pads 24 are made of aluminum nitride, they may be substantially textured and have a preferred polarity. The texturing of pads 24 may be obtained by an additional treatment carried out after the deposition of seed pads 24. It for example is an anneal under an ammonia flow (NH3).

(2) Protecting the portions of surface 22 of substrate 10 which are not covered with seed pads 24 to avoid the subsequent growth of wires on these portions. This may be obtained by a nitriding step which causes the forming, at the surface of substrate 10, between seed pads 24, of silicon nitride regions (for example, Si3N4).

(3) Growing lower portion 28 of each wire 26 up to height H2. Each wire 26 grows from the top of the underlying seed pad 24.

Wires 26 may be grown by a process of CVD, MOCVD, MBE, GSMBE, PAMBE, ALE, HVPE type. Further, electrochemical processes may be used, for example, chemical bath deposition (CBD), hydrothermal processes, liquid aerosol pyrolysis, or electro-deposition.

As an example, the wire growth method may comprise injecting into a reactor a precursor of a group-III element and a precursor of a group-V element. Examples of precursors of group-III elements are trimethylgallium (TMGa), triethylgallium (TEGa), trimethylindium (TMIn), or trimethylaluminum (TMAl). Examples of precursors of group-V elements are ammonia (NH3), tertiarybutylphosphine (TBP), arsine (AsH3), or unsymmetrical dimethylhydrazine (UDMH).

According to an embodiment of the invention, in a first phase of growth of the wires of the III-V compound, a precursor of an additional element is added in excess, in addition to the precursors of the III-V compound. The additional element may be silicon (Si). An example of a precursor of silicon is silane (SiH4).

As an example, in the case where upper portion 28 is made of heavily-doped N-type GaN, a MOCVD-type method may be implemented by injection, into a showerhead-type MOCVD reactor, of a gallium precursor gas, for example, trimethylgallium (TMGa) and a nitrogen precursor gas, for example, ammonia (NH3). As an example, a showerhead-type 3×2" MOCVD reactor commercialized by AIXTRON, may be used. A molecular flow ratio between trimethylgallium and ammonia within the 5-200 range, preferably within the 10-100 range, enables to promote the growth of wires. As an example, a carrier gas which ensures the diffusion of organometallic elements all the way to the reactor charges with organometallic elements in a TMGa bubbler. The latter is set according to the standard operating conditions. A flow of 60 sccm (standard cubic centimeters per minute) is for example selected for TMGa, while a 300-sccm flow is used for NH3 (standard NH3 bottle). A pressure of approximately 800 mbar (800 hPa) is used. The gaseous mixture further comprises silane injected into the MOCVD reactor, which material is a precursor of silicon. The silane may be diluted in hydrogen at 1,000 ppm and a 20-sccm flow is provided. The temperature in the reactor is for example in the range from 950° C. and 1,100° C., preferably from 990° C. to 1,060° C. To transport species from the outlet of the bubblers to the two reactor plenums, a 2,000-sccm flow of carrier gas, for example, N2, distributed between the two plenums, is used. The previously-indicated gas flows are given as an indication and should be adapted according to the size and to the specificities of the reactor.

The presence of silane among the precursor gases results silicon being incorporated within the GaN compound. A lower N-type doped portion 28 is thus obtained. This further translates as the forming of a silicon nitride layer, not shown, which covers the periphery of portion 28 of height H2, except for the top, as portion 28 grows.

(4) Growing upper portion 30 of height H3 of each wire 26 on the top of lower portion 28. For the growth of upper portion 30, the previously-described operating conditions of the MOCVD reactor are, as an example, maintained but for the fact that the silane flow in the reactor is decreased, for example, by a factor greater than or equal to 10, or stopped. Even when the silane flow is stopped, upper portion 30 may be N-type doped due to the diffusion in this active portion of dopants originating from the adjacent passivated portions or due to the residual doping of GaN.

(5) Forming by epitaxy, for each wire 26, the layers forming shell 34. Given the presence of the silicon nitride layer covering the periphery of lower portion 28, the deposition of the layers forming shell 34 only occurs on upper portion 30 of wire 26.

(6) Forming insulating layer 32, for example, by conformally depositing an insulating layer over the entire structure obtained at step (5) and etching this layer to expose shell 34 of each wire 26. In the previously-described embodiment, insulating layer 32 does not cover shell 34. As a variation, insulating layer 32 may cover a portion of shell 34. Further, insulating layer 32 may be formed before shell 34.

(7) Forming electrode 36, for example, by conformal deposition.

(8) Forming conductive layer 38, for example, by physical vapor deposition (PVD) over the entire structure obtained at step (7) and etching this layer to expose each wire 26. FIG. 2B shows the structure obtained after having deposited an encapsulation layer 40 over the entire wafer 10. The maximum thickness of encapsulation layer 40 is in the range from 12 μm to 1,000 μm, for example, approximately 50 μm, so that encapsulation layer 40 totally covers electrode 36 at the top of light-emitting diodes DEL. Encapsulation layer 40 is made of an at least partially transparent insulating material.

Encapsulation layer 40 may be made of an at least partially transparent inorganic material.

As an example, the inorganic material is selected from the group comprising silicon oxides, of type SiOx where x is a real number between 1 and 2, or SiOyNz where y and z are real numbers between 0 and 1, and aluminum oxides, for example, Al2O3. The inorganic material may then be deposited by low-temperature CVD, particularly at a temperature lower than 300° C.-400° C., for example by PECVD (plasma enhanced chemical vapor deposition).

Encapsulation layer 40 may be made of an at least partially transparent organic material. As an example, encapsulation layer 40 is a silicone polymer, an epoxy polymer, an acrylic polymer, or a polycarbonate. Encapsulation layer 40 may then be deposited by a spin coating method, by an inkjet printing method, or by a silk-screening method. A method of dispensing by time pressure dispenser or by volumetric dispenser is also possible in automated mode on programmable equipment.

FIG. 2C shows the structure obtained after attaching an additional support 42, called handle, on encapsulation layer 40. As an example, the handle has a thickness in the range from 200 μm to 1,000 μm.

According to an embodiment, handle 42 is intended to be kept on the optoelectronic devices once sawn. Handle 42 then is made of an at least partly transparent material. It may be glass, particularly a borosilicate glass, for example, Pyrex, or sapphire. An observer perceives the light rays emitted by light-emitting diodes DEL which cross surface 43 of handle 42 opposite to encapsulation layer 40.

According to another embodiment, handle 42 is intended to be removed at a subsequent step of the manufacturing method. In this case, handle 42 may be made of any type material compatible with the subsequent steps of the manufacturing method. It may be silicon or any planar substrate compatible with microelectronics flatness criteria.

Handle 42 may be attached to encapsulation layer 40 by any means, for example, by bonding, for example by using a layer of organic temperature-crosslinkable glue, not shown, or also by molecular bonding (direct bonding) or optical bonding with UV-cured glue. When encapsulation layer 40 is made of an organic material, this material may be used as glue for handle 42. When a glue layer is used, it should be at least partially transparent.

FIG. 2D shows the structure obtained after a step of thinning substrate 10. After thinning, the thickness of substrate 10 may be in the range from 20 μm to 200 μm, for example, approximately 30 μm. The thinning step may be carried out by one or more than one milling or etching step, and or by chemical mechanical polishing methods (CMP). Thinned substrate 10 comprises a surface 44 opposite to surface 22. Surfaces 22 and 44 are preferably parallel.

FIG. 2E shows the structure obtained after the steps of:
forming an insulating layer 45, for example, made of silicon oxide (SiO2) or of silicon oxynitride (SiON), on the rear surface of substrate 10. Insulating layer 45 is for example carried out by conformal deposition by PECVD;
etching, for each optoelectronic device, at least one opening 46 crossing insulating layer 45, substrate 10, insulating layer 32, and electrode 36 to expose a portion of metal layer 38. The etching of substrate 10 may be a deep reactive ion etching (DRIE). The etching of the portion of insulating layer 32 is also performed by plasma etching with the chemistry adapted to insulating layer 32. At the same time, electrode layer 36 may be etched. As a variation, layer 36 may be removed from the areas where vias 46 are formed before the step of forming metal layer 38. Opening 46 may have a circular cross-section. The diameter of opening 46 may then be in the range from 5 μm to 200 μm according to the size of unit optoelectronic component 14 such as shown in FIG. 1, for example, approximately 15 μm. A plurality of circular openings 46 may then be simultaneously formed to create connections in parallel. This enables to decrease the resistance of connections. Such connections may be arranged at the periphery of the area where light-emitting diodes DEL are formed. As a variation, opening 46 may correspond to a trench, for example extending along at least one side of the optoelectronic device. Preferably, the trench width is in the range from 15 μm to 200 μm according to the size of unit optoelectronic component 14 such as shown in FIG. 1, for example, approximately 15 μm;
forming an insulating layer 48, for example, made of SiO2 or SiON, on the internal walls of opening 46 and, possibly on layer 45, the portion of layer 48 covering layer 45 not being shown in the drawings. Insulating layer 48 is for example formed by conformal PECVD. Insulating layer 48 has a thickness in the range from 200 nm to 5,000 nm, for example, approximately 3 μm;
etching insulating layer 48 to expose conductive layer 38 at the bottom of opening 46. This etching is anisotropic; and
etching at least one opening 50 in insulating layer 45 to expose a portion of surface 44 of substrate 10. To perform this etching, opening 46 may be temporarily obstructed, for example, with a resin.

Figure 2F:
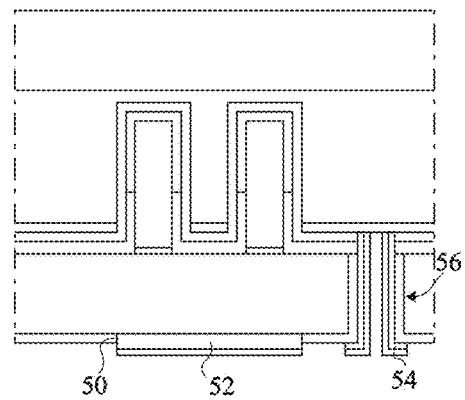

FIG. 2F shows the structure obtained after the forming of a second electrode 52 in opening 50 and of a conductive layer 54 on insulating layer 48, conductive layer 54 covering the internal walls of opening 46 to come into contact with metal portion 36, and extending on surface 44 around opening 46. Electrode 52 and conductive layer 54 may comprise a stack of two layers, as shown in the drawings, or more than two layers. It for example is TiCu or TiAl. This layer may be covered with another metal layer, for example, gold, copper, or eutectic alloys (Ni/Au or Sn/Ag/Cu) to implement a soldering method. Second electrode 52 and conductive layer 54 may be formed, particularly in the case of copper, by electrochemical deposition (ECD). The thickness of electrode layer 52 and conductive layer 54 may be in the range from 1 μm to 10 μm, for example, approximately 5 μm.

The assembly comprising opening 46, insulating layer 48, and conductive layer 54 forms a vertical connection 56 or TSV (Through Silicon Via). Vertical connection 56 enables to bias first electrode 36 from the rear surface of substrate 10 while the biasing of wires 26 is obtained by second electrode 52 through substrate 10.

Figure 3A:
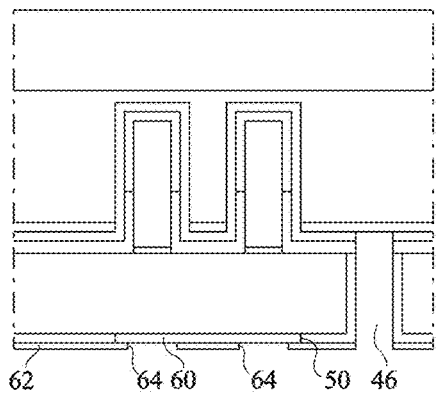
FIGS. 3A and 3B are partial simplified cross-section views of structures obtained at successive steps of another embodiment of a method of manufacturing optoelectronic devices comprising microwires or nanowires.
Figure 3B:
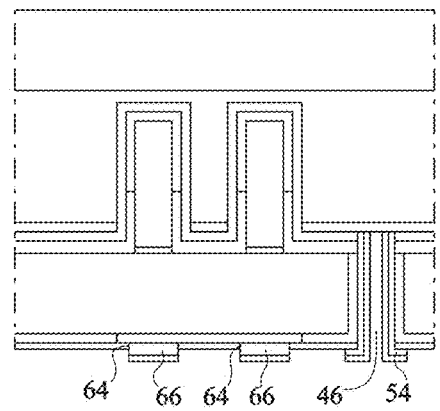

FIGS. 3A and 3B are partial simplified cross-section views of structures obtained at successive steps of another embodiment of a method of manufacturing optoelectronic devices with wires, which comprises all the steps described in relation with FIGS. 2A to 2E.

FIG. 3A shows the structure obtained after the steps of:
forming in opening 50 of insulating layer 44 a conductive pad 60;
depositing an insulating layer 62 particularly covering metal pad 60. Insulating layer 62 may be made of silicon oxide or of silicon nitride or may correspond to a stack of two stacked layers or more and have a thickness in the range from 200 nm to 1,000 nm; and
etching openings 64 in insulating layer 62 to expose portions of conductive pad 60.

FIG. 3B shows the structure obtained after steps similar to what has been previously described in relation with FIG. 2F to form second electrodes 66 in openings 64 and conductive layer 54 in opening 46.

The embodiment described in relation with FIGS. 3A and 3B advantageously enables to adjust the positions and the dimensions of second electrodes 66.

Figure 4:
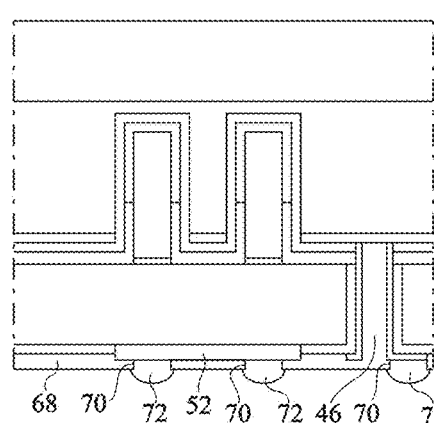
FIGS. 4 and 5 are partial simplified cross-section views of structures obtained by other embodiments of methods of manufacturing optoelectronic devices comprising microwires or nanowires.

FIG. 4 illustrates another embodiment of a manufacturing method comprising, after the steps previously described in relation with FIG. 2F, the steps of:
depositing an insulating layer 68 particularly covering pad 52 and filling opening 46. It may be an insulating polymer, for example, a BCB (benzocyclobutene) resist having a thickness in the range from 2 μm to 20 μm, or a silicon oxide, or silicon nitride, or both, and have a thickness in the range from 200 nm to 1,000 nm;
forming openings 70 in insulating layer 68 to expose portions of second electrode 52 and conductive layer 54. It may be a plasma-type etching when insulating layer 68 is made of an inorganic material or steps of illumination and development when insulating layer 68 is made of a resist; and forming conductive bumps 72 in openings 70. Bumps 72 are made of materials compatible with soldering operations in electronics, for example tin- or gold-based alloys. Bumps 72 may be used to attach the optoelectronic device to a support, not shown.

In the previously-described embodiments, the current flows between first electrode 36 and second electrode 52, 66 through substrate 10.

Figure 5:
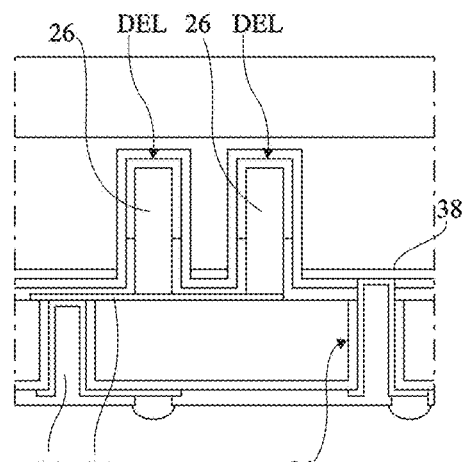

FIG. 5 illustrates another embodiment where the light-emitting diodes are directly biased at the base of wires 26. Wires 26 are formed on a seed layer 74, which is then common to an assembly of light-emitting diodes DEL of the optoelectronic device. A vertical connection 76 is formed in substrate 10, for example, similarly to vertical connection 56, with the difference that vertical connection 76 is connected to seed layer 74.

Figure 6A:
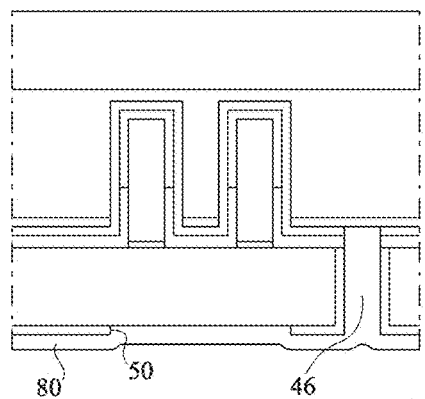
FIGS. 6A to 6C are partial simplified cross-section views of structures obtained at successive steps of another embodiment of a method of manufacturing optoelectronic devices comprising microwires or nanowires.
Figure 6B:
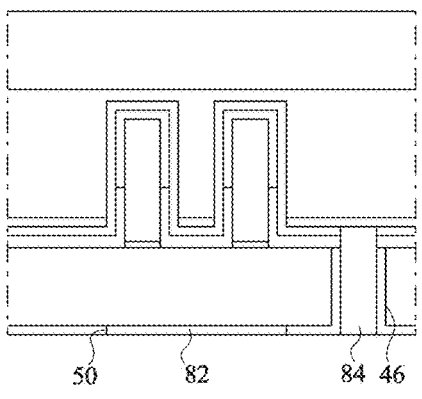
Figure 6C:
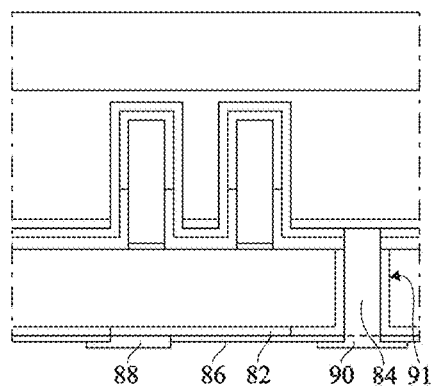

FIGS. 6A to 6C are partial simplified cross-section views of structures obtained at successive steps of another embodiment of a method of manufacturing optoelectronic devices with wires which comprises all the steps described in relation with FIGS. 2A to 2E.

FIG. 6A shows the structure obtained after the deposition of a thick metal layer 80, for example, copper. It may be an ECD. The thickness of insulating layer 80 is for example in the order of 10 µm. Metal layer 80 is sufficiently thick to fill opening 46.

FIG. 6B shows the structure obtained after a step of polishing metal layer 80 to delimit a metal portion 82 in opening 50 and a metal portion 84 in opening 46. The step of planarizing layer 80 may be carried out by CMP.

FIG. 6C shows the structure after steps similar to those previously described in relation with FIGS. 3A and 3B, comprising depositing an insulating layer 86 over the entire rear surface of substrate 10 and forming a second electrode 88 crossing layer 86 in contact with metal portion 82 and a conductive pad 90 crossing layer 86 in contact with metal portion 84. A passivation layer, particularly made of polymer, may be deposited on the structure on the rear surface side, openings being formed in the passivation layer to expose electrode 88 and conductive pad 90.

The assembly comprising opening 46, insulating layer 48, metal portion 84, and metal pad 90 forms a TSV 91 which plays the same role as previously-described TSV 56. Metal pads 88 and 90 are used to assemble the optoelectronic component encapsulated on its final support, for example, a printed circuit. The assembly methods may be carried out by soldering. The metal stack is selected to be compatible with solder operations used in electronics, and particularly with the soldering used, for example, in Cu with an organic solderability preservative finish (OSP) or Ni—Au finish (by a process which may be chemical (ENIG, Electroless nickel immersion gold) or electrochemical), Sn, Sn—Ag, Ni—Pd—Au, Sn—Ag—Cu, Ti—Wn-Au, or ENEPIG (Electroless Nickel/Electroless Palladium Immersion Gold).

Figure 7A:
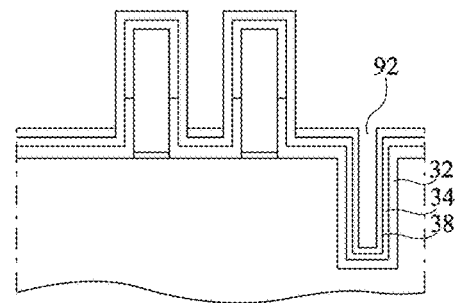
FIGS. 7A and 7B are partial simplified cross-section views of structures obtained at successive steps of another embodiment of a method of manufacturing optoelectronic devices comprising microwires or nanowires.
Figure 7B:
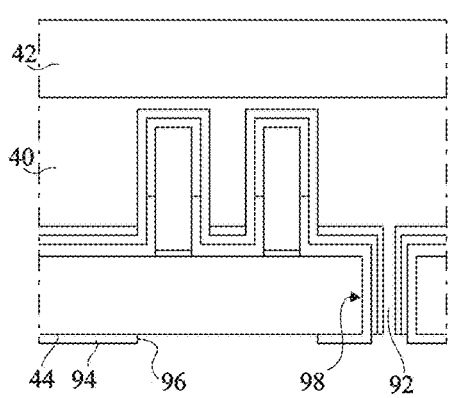

FIGS. 7A and 7B are partial simplified cross-section views of structures obtained at successive steps of another embodiment of a method of manufacturing optoelectronic devices with wires.

The initial steps may comprise the steps previously described in relation with FIG. 2A, with the difference that, before steps (5) to (7), an opening 92 is formed in substrate 10. Opening 92 may be formed by a DRIE-type etching. The depth of opening 92 is strictly greater than the thickness of substrate 10 after the thinning step. As an example, the depth of opening 92 is in the range from 10 µm to 200 µm, for example, in the order of 35 µm.

During the implementation of steps (5) to (7), insulating layer 32, electrode 36, and conductive layer 38 are also formed in opening 92.

FIG. 7B shows the structure obtained after the carrying out of the steps of:

depositing encapsulation layer 40 similarly to what has been previously described in relation with FIG. 2B. Encapsulation layer 40 partially or totally penetrates into opening 92;

installing handle 42 similarly to what has been previously described in relation with FIG. 2C;

thinning substrate 10 similarly to what has been previously described in relation with FIG. 2D all the way to opening 92;

forming an insulating layer 94 on rear surface 44 of substrate 10 while protecting opening 92; and forming an opening 96 in insulating layer 94 to expose a portion of substrate 10.

The assembly comprising opening 92 and the portions of insulating layer 32, of electrode layer 36, and of conductive layer 38 extending in opening 92 forms a TSV 98 which plays the same role as previously-described TSV 56.

The subsequent steps of the method may be similar to what has been previously described in relation with FIG. 2F.

Figure 8:
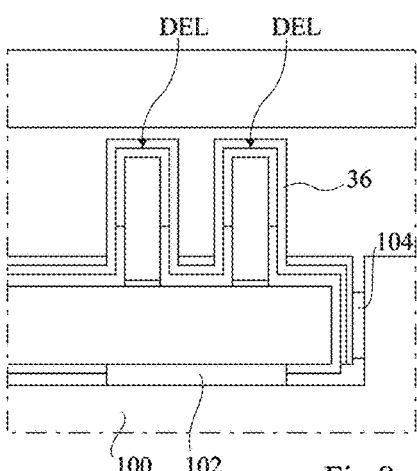
FIGS. 8 to 10 are partial simplified cross-section views of structures obtained by other embodiments of methods of manufacturing optoelectronic devices comprising microwires or nanowires.

FIG. 8 shows an embodiment where substrate 10 is at least sawn once at the level of a TSV which may correspond to one of previously-described TSVs 56, 91, or 98. The sawing exposes a portion of the conductive layer which extends on the internal walls of the TSV. The biasing of first electrode 36 of light-emitting diodes DEL may then be performed from the side of the optoelectronic device. As an example, the optoelectronic device may be attached to a support 100 by a connection pad 102 in contact with the rear surface of substrate 14 and by a connection pad 104 in contact with the lateral exposed portion of the TSV.

Figure 9:
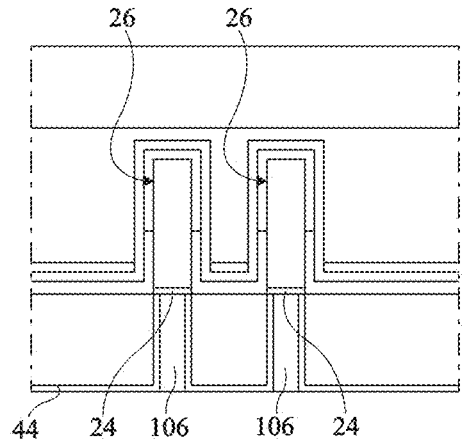

FIG. 9 shows an embodiment where a TSV 106 is provided at the level of each wire 26 of the optoelectronic device. Each TSV 106 comes into contact with seed pad 24 of the associated wire 26. TSVs 106 may be unconnected to one another. Wires 26 can then be separately biased. As a variation, an electrode, not shown, provided on the side of rear surface 44 of substrate 10, may be connected to all the vertical connections 106 associated with a same optoelectronic device.

Figure 10:
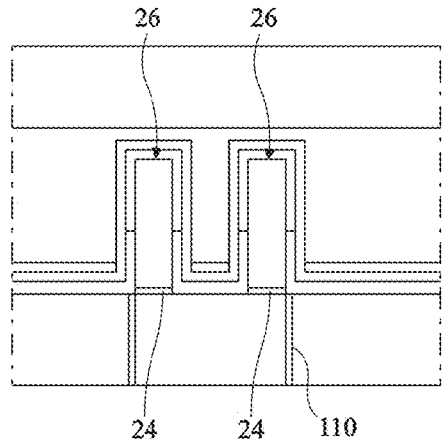

FIG. 10 shows an embodiment where a TSV 110 simultaneously comes into contact with seed pads 24 of a plurality of wires 26. Vertical connections 106, 110 may be formed according to any of the manufacturing methods previously described for the forming of TSVs 56, 91, and 98.

FIGS. 11A to 11D are partial simplified cross-section views of structures obtained at successive steps of another embodiment of a method of manufacturing optoelectronic devices with wires.

Figure 11A:
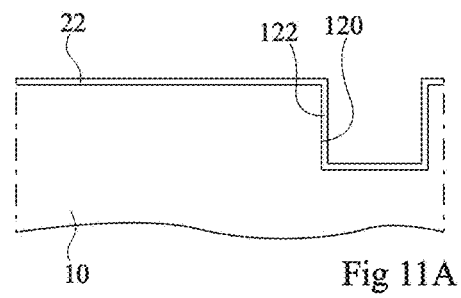
FIGS. 11A to 11D are partial simplified cross-section views of structures obtained at successive steps of another embodiment of a method of manufacturing optoelectronic devices comprising microwires or nanowires.
Figure 11B:
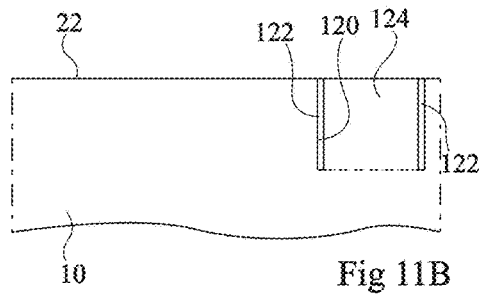

FIGS. 11A and 11B show structures obtained after the carrying out of steps before step (1) previously described in relation with FIG. 2A.

FIG. 11A shows the structure obtained after the steps of:

etching an opening 120 in substrate 10. Opening 120 may be formed by an etching of reactive ion etching type, for example, a DRIE etching. The depth of opening 120 is strictly greater than the targeted thickness of substrate 10 after the thinning step. As an example, the depth of opening 120 is in the range from 10 µm to 200 µm, for example, approximately 35 µm. The distance between the lateral walls of opening 120 is in the range from 1 to 10 µm and for example 2 µm; and forming an insulating portion 122, for example, made of silicon oxide, on the lateral walls of opening 120, for example, by a thermal oxidation method. At this step, an insulating portion may also form at the bottom of opening 120 and on the rest of substrate 10. The thickness of insulating portion may be in the range from 100 nm to 3,000 nm, for example, approximately 200 nm.

FIG. 11B shows the structure obtained after carrying out the steps of:

anisotropically etching the insulating portion at the bottom of opening 120 and the insulating portion covering surface 22 of substrate 10, to keep insulating portions 122 on the lateral sides of opening 120. As an example, the etching of the insulating portion covering surface 22 of substrate 10 may be omitted. In this case, a mask formed by photolithography may be provided to protect said unetched insulating portions;

filling opening 120 with a filling material, for example, polysilicon, tungsten, or a refractory metallic material which supports the thermal budget during the previously-described steps carried out a high temperatures, particularly in relation with steps 2A to 2D, for example, deposited by LPCVD. Polysilicon advantageously has a thermal expansion coefficient close to that of silicon and thus enables to decrease the mechanical stress during the previously-described steps carried out at high temperatures, particularly in relation with steps 2A to 2D;

removing the layer of filling material, for example, by a CMP-type method. In the case where the etching of the insulating portion covering surface 22 of substrate 10 has been omitted during the anisotropic etching of the insulating portion at the bottom of opening 122, said unetched layer may advantageously be used as a stop layer during the removal of the layer of filling material. In this case, the removal of the layer of filling material is followed by a step of etching the insulating portion covering surface 22 of substrate 10. A portion 124 of the filling material is thus obtained.

Figure 11C:
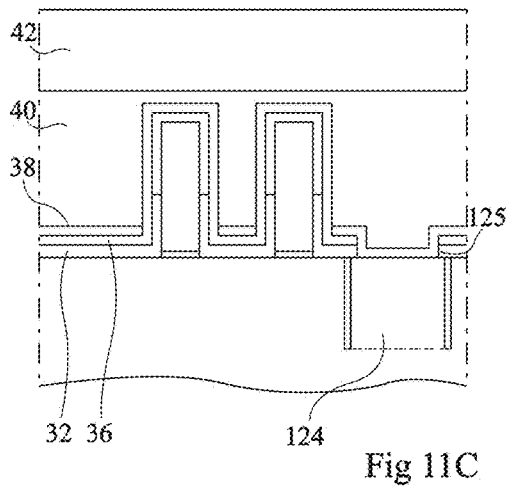

FIG. 11C shows the structure obtained after the implementation of steps similar to what has been previously described in relation with FIGS. 2A to 2D, with the difference that it comprises, before the forming of conductive layer 38, a step of etching an opening 125 in electrode layer 36 and of insulating layer 32 so that conductive layer 38 comes into contact with portion 124.

Figure 11D:
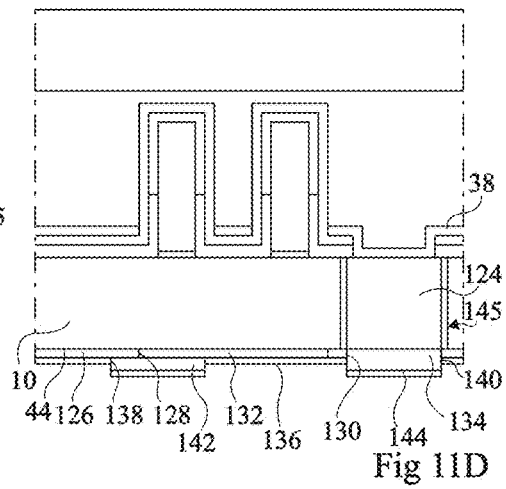

FIG. 11D shows the structure obtained after implementation of the following steps, similarly to what has been previously described in relation with FIGS. 7B, 3A, and 3B:

thinning substrate 10 to reach conductive portion 124;

forming an insulating layer 126 on rear surface 44 of substrate 10;

forming, in insulating layer 126, an opening 128 to expose a portion of rear surface 44 of substrate 10 and an opening 130 to expose conductive portion 124;

forming a conductive pad 132 in opening 128 in contact with substrate 10 and with a conductive pad 134 in opening 130 in contact with conductive portion 124;

forming an insulating layer 136 covering insulating layer 126 and conductive pads 132, 134;

forming, in insulating layer 136, an opening 138 to expose a portion of conductive pad 132 and an opening 140 to expose conductive pad 134; and forming a second electrode 142 in opening 138 in contact with conductive pad 132 and a conductive pad 144 in opening 130 in contact with conductive pad 134.

The assembly comprising portion 124 of the filling material delimited by insulating portions 122 forms a TSV 145 which plays the same role as previously-described TSV 56. Conductive portion 124 which connects pad 144 to metal layer 38 is formed by portion 124 of the filling material.

As a variation, insulating layer 126 may be absent and conductive pads 132, 144 may be directly formed on substrate 10.

According to another variation, instead of forming a portion 124 of a filling material insulated from substrate 10 by insulating portions, the method may comprise steps of forming insulating trenches delimiting a portion of the substrate which then plays the role of portion 124. Preferably, heavily-doped silicon, for example having a dopant concentration greater than or equal to 1019 atoms cm3, is used to decrease the resistance of this connection. This conductive portion may be formed by one or a plurality of silicon trenches around the active area or by one or a plurality of insulated silicon vias.

The embodiment previously described in relation with FIGS. 11A to 11D may be implemented to form vertical connections 106 and 110 previously described in relation with FIGS. 9 and 10.

FIGS. 12A to 12E are partial simplified cross-section views of structures obtained at successive steps of another embodiment of a method of manufacturing optoelectronic devices with wires. The initial steps may comprise the steps previously described in relation with FIGS. 2A to 2C, with the difference that conductive layer 38 is not present.

FIG. 12A shows the structure obtained after a step of removing substrate 10. The removal of substrate 10 may be performed by one or more than one etch step. The rear surface of the structure thus exposed after removal of the substrate is designated with reference numeral 150. In FIG. 12A, the etching is stopped on insulating layer 32 and on seed pads 24. As a variation, the method may further comprise removing seed pads 24.

FIG. 12B shows the structure obtained after carrying out the steps of:

etching an opening 152 in insulating layer 32;

depositing a mirror layer 154 on rear surface 150 and in opening 152; and depositing a conductive layer 156 covering mirror layer 154.

Mirror layer 154 may be a single layer or correspond to a stack of two layers or of more than two layers. As an example, mirror layer 154 corresponds to a metal monolayer. According to another example, mirror layer 154 corresponds to a stack of layers comprising a metal layer covered with a dielectric layer or with a plurality of dielectric layers. The metal layer of mirror layer 154 may be formed on a bonding layer, for example, made of titanium. The thickness of mirror layer 154 (monolayer or multilayer) is greater than 15 nm, for example, in the range from 30 nm to 2 µm. Mirror layer 154 may be deposited by ECD.

According to an embodiment, mirror layer 154 is capable of at least partly reflecting the radiation emitted by light-emitting diodes DEL.

According to an embodiment, the complex optical indexes of the materials forming seed pads 24 and mirror layer 154 (monolayer or multilayer) and the thicknesses of seed pads 24 and of mirror layer 154 are selected to increase the mean reflectivity of seed pads 24 and mirror layer 154. The mean reflectivity of a layer or of a stack of layers is the mean of the ratio of the electromagnetic energy reflected by the layer or the stack of layers to the incident energy for all possible angles of incidence at a given wavelength. It is desirable for the mean reflectivity to be as high as possible, preferably greater than 80%.

The complex optical index, also called complex refraction index, is a dimensionless number which characterizes the optical properties of a medium, particularly the absorption and the diffusion. The refraction index is equal to the real part of the complex optical index. The extinction coefficient, also called attenuation coefficient, measures the energy loss of an electromagnetic radiation crossing this material. The extinction coefficient is equal to the opposite of the imaginary part of the complex refraction index. The refraction index and the extinction coefficient of a material may be determined, for example, by ellipsometry. A method of analyzing ellipsometric data is described in the work entitled "Spectroscopic ellipsometry, Principles and Applications" by Hiroyuki Fujiwara, published by John Wiley & Sons, Ltd (2007).

As an example, the material forming the metal layer of mirror layer 154 (monolayer or multilayer) may be aluminum, silver, chromium, rhodium, ruthenium, palladium, or an alloy of two of these compounds or of more than two of these compounds.

According to an embodiment, the thickness of each seed pad 24 is smaller than or equal to 20 nm.

According to an embodiment, the refractive index of each seed pad 24 is in the range from 1 to 3 for a wavelength in the range from 380 nm to 650 nm.

According to an embodiment, the extinction coefficient of each seed pad 24 is smaller than or equal to 3 for a wavelength in the range from 380 nm to 650 nm.

As an example, the material forming each seed pad 24 may correspond to the previously-indicated examples.

Conductive layer 156 may be made of aluminum, of silver, or of any other conductive material. As an example, it has a thickness in the range from 30 nm to 2,000 nm. Conductive layer 156 may be deposited by ECD. Mirror layer 154 and conductive layer 156 may be confounded.

FIG. 12C shows the structure obtained after a step of etching conductive layer 156 and mirror layer 154 to delimit a pad 158, comprising a portion 160 of mirror layer 154 and a portion 162 of conductive layer 156, connected to electrode layer 36 and a pad 164, comprising a portion 166 of mirror layer 154 and a portion 168 of conductive layer 156, connected to seed pads 24.

FIG. 12D shows the structure obtained after the steps of:
depositing an insulating layer 170 extending on pads 158, 164 and between pads 158, 164;
etching, in insulating layer 170, an opening 172 exposing conductive pad 158 and an opening 174 exposing conductive pad 164; and
depositing a conductive layer 176 covering insulating layer 170 and penetrating into openings 172, 174.

Insulating layer 170 may be made of silicon dioxide deposited by low-temperature PECVD or an organic material of BCB, Epoxy type having a thickness of a few microns, typically 3-5 µm.

Conductive layer 176 may be made of TiCu or TiAl. As an example, it has a thickness in the range from 500 nm to 2 µm.

FIG. 12E shows the structure obtained after a step of etching conductive layer 176 to delimit a conductive pad 178 connected to conductive pad 158, a second electrode 180 connected to conductive pad 164, and a conductive portion 182 in contact with insulating layer 170. Conductive portion 182 may play the role of a radiator. Insulating layer 170 may particularly enable to electrically insulate heat sink 182 from electric contact pad 158 and/or from conductive layer 156.

The embodiment described in relation with FIGS. 12A to 12E has the advantage of suppressing the series resistance due to substrate 10.

Figures 13, 14:
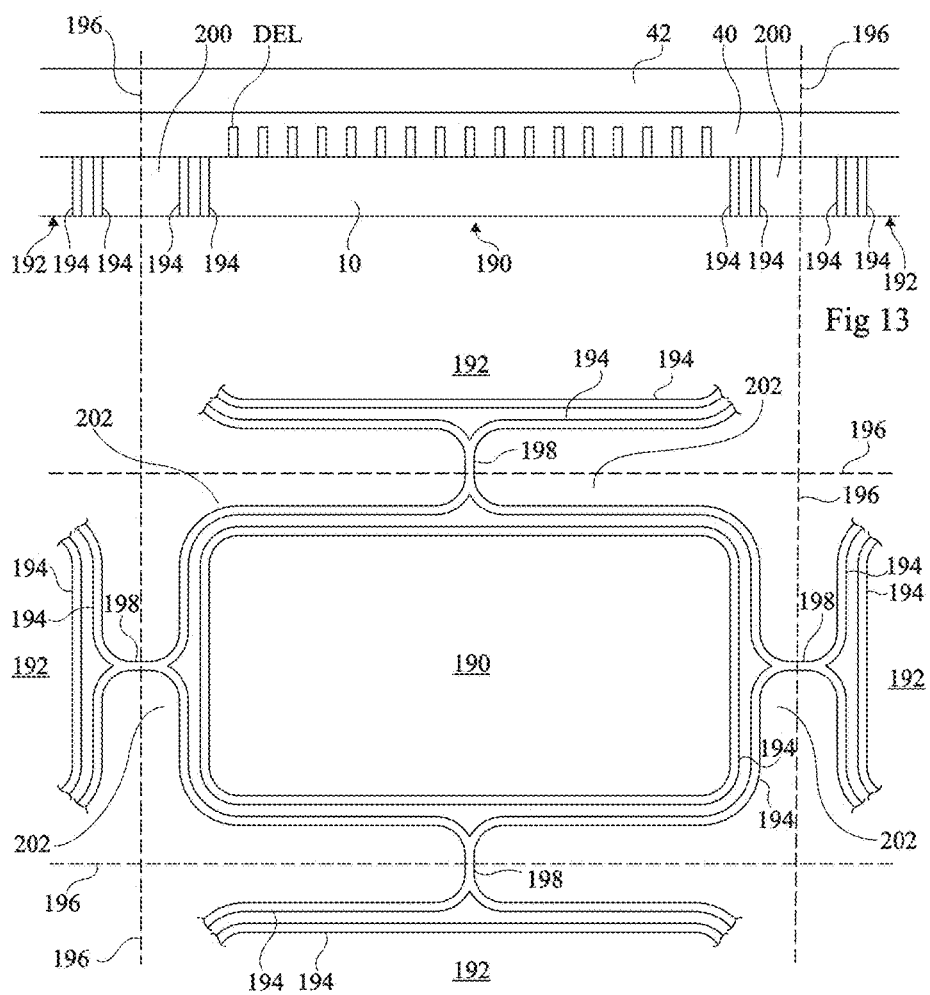
FIG. 13 is a partial simplified cross-section view of an embodiment of an optoelectronic device comprising microwires or nanowires formed on a substrate wafer before sawing of the substrate.
FIG. 14 is a partial simplified top view of the optoelectronic device of FIG. 13.

FIGS. 13 and 14 respectively are a cross-section view and a top view, partial and simplified, of an embodiment of an optoelectronic device 190 with wires formed on a wafer 10 of a substrate after the step of thinning substrate 10 and before the sawing of substrate 10. In FIG. 13, optoelectronic devices 192 adjacent to optoelectronic device 190 have further been partially shown.

Each optoelectronic device 190, 192 is surrounded with one or a plurality of trenches 194 (two in the present example) filled with an insulating material, which extend across the entire thickness of thinned substrate 10. As an example, each trench has a width greater than 1 µm, for example, approximately 2 µm. The distance between the two trenches 194 is greater than 5 µm, for example, approximately 6 µm. The sawing lines of substrate 10, shown by short-dashed lines 196, are formed between trenches 194 of optoelectronic device 190 and trenches 194 of the adjacent optoelectronic devices 192. Trenches 194 provide a lateral electric insulation of the silicon substrate and thus of optoelectronic device 190 after sawing.

As shown in FIG. 14, additional trenches 198 connect the external trenches 194 of two adjacent optoelectronic devices 190, 192. After the sawing, a portion 200 of substrate 10 remains at the periphery of each optoelectronic device 190, 192. Trenches 198 enable to divide peripheral portion 200 into a plurality of insulated segments 202. This enables to decrease short-circuit risks in the case where conductive pads would come into contact with these segments.

According to an embodiment, the optoelectronic device further comprises phosphors capable, when they are excited by the light emitted by the light-emitting diodes, of emitting light at a wavelength different from the wavelength of the light emitted by the light-emitting diodes. As an example, the light-emitting diodes are capable of emitting blue light and the phosphors are capable of emitting yellow light when they are excited by blue light. Thereby, an observer perceives a light corresponding to a composition of the blue and yellow lights which, according to the proportion of each light, may be substantially white. The final color perceived by the observer is characterized by its chromatic coordinates such as defined by the standards of the International Committee on Illumination.

According to an embodiment, a layer of phosphors is provided within encapsulation layer 40. Preferably, the mean diameter of the phosphors is selected so that at least part of the phosphors distribute between wires 26 during the step of forming encapsulation layer 40. Preferably, the phosphors have a diameter in the range from 45 nm to 500 nm. The phosphor concentration and the thickness of the phosphor layer are then adjusted according to the targeted chromatic coordinates.

The extraction ratio of an optoelectronic device is generally defined by the ratio of the number of photons escaping from the optoelectronic device to the quantity of photons emitted by the light-emitting diodes. Each light-emitting diode emits light in all directions, and particularly towards the neighboring light-emitting diodes. The active layer of a light-emitting diode tends to capture photons having a wavelength smaller than or equal to the transmission wavelength. Thereby, part of the light emitted by a light-emitting diode is generally captured by the active layers of the neighboring light-emitting diodes. An advantage of arranging phosphors between wires 26 is that the phosphors convert part of the light, for example, blue, emitted by a light-emitting diode into a light at a higher wavelength, for example, yellow, before the blue light reaches the neighboring light-emitting diodes. Since yellow light is not absorbed by the active layers of the neighboring light-emitting diodes, the extraction ratio of the optoelectronic device is increased.

Another advantage is that since the phosphors are located close to substrate 10, the discharge by the substrate of the heat generated during the heating of the phosphors in operation is improved.

Another advantage is that since the phosphors are not arranged in a separate layer, the total thickness of the optoelectronic device is decreased.

Another advantage is that the homogeneity of the light emitted by the optoelectronic device is improved. Indeed, the light which escapes from encapsulation layer 40 in all directions corresponds to a composition of the light emitted by the light-emitting diodes and of the light emitted by the phosphors.

Figure 15:
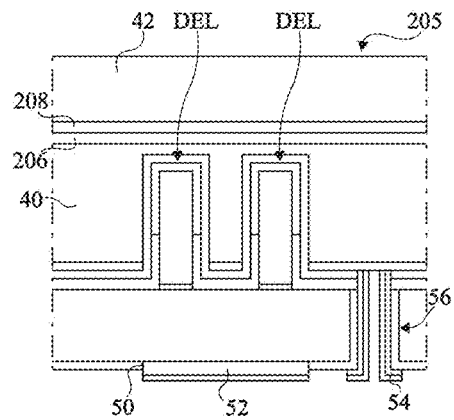
FIGS. 15 to 27 are partial simplified cross-section views of embodiments of optoelectronic devices comprising microwires or nanowires.\

FIG. 15 shows an embodiment of an optoelectronic device 205 comprising all the elements shown in FIG. 2F and further comprising, between encapsulation layer 40 and handle 42, a layer of phosphors 206 extending on encapsulation layer 40 and possibly a layer of glue 208 extending of phosphor layer 206, handle 42 extending on glue layer 208. The thickness of phosphor layer 206 may be in the range from 50 µm to 100 µm. Phosphor layer 206 may correspond to a layer of silicone or of an epoxide polymer having the phosphors embedded therein. Phosphor layer 206 may be deposited by a spin coating method, by an inkjet printing method, or by a silk-screening method or by a sheet deposition method. The phosphor concentration and the thickness of phosphor layer 206 are adjusted according to the targeted chromatic coordinates. As compared with the embodiment where the phosphors are present in encapsulation layer 40, phosphors of larger diameter may be used. Further, the phosphor distribution in phosphor layer 206 and the thickness of phosphor layer 206 may be more easily controlled.

Figure 16:
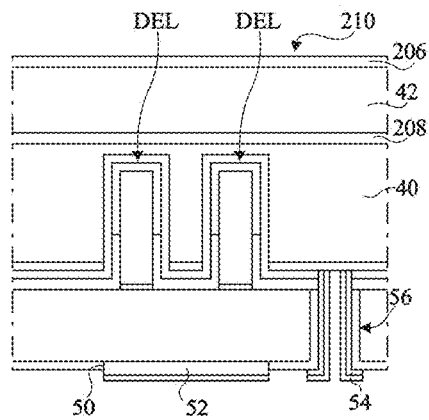

FIG. 16 shows an embodiment of an optoelectronic device 210 comprising all the elements of optoelectronic device 205 shown in FIG. 15, with the difference that phosphor layer 206 covers handle 42. A protection layer, not shown, may cover phosphor layer 206. In the present embodiment, phosphor layer 206 is advantageously formed in the last steps of the optoelectronic device manufacturing method. The colorimetric properties of the optoelectronic device may thus further be modified during the most part of the optoelectronic device manufacturing method. Further, the colorimetric properties of the optoelectronic device may easily be corrected at the end of the process if necessary by modifying the phosphor layer, for example, by adding an additional phosphor layer.

Figure 17:
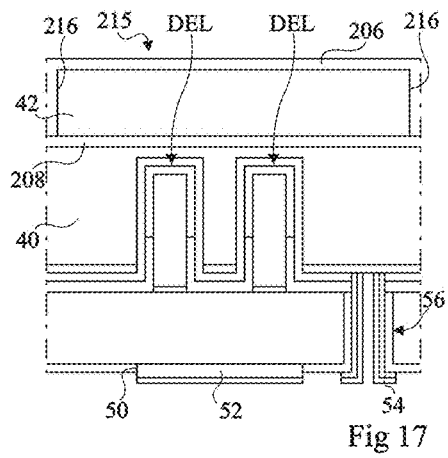

FIG. 17 shows an embodiment of an optoelectronic device 215 comprising all the components of optoelectronic device 210 shown in FIG. 16 and further comprising trenches 216 extending in handle 42 and filled with phosphor layer 206. Preferably, trenches 216 extend across the entire thickness of handle 42. The distance between the lateral walls of each trench 216 is preferably substantially equal to the thickness of phosphor layer 206 covering handle 42.

For optoelectronic device 210, shown in FIG. 16, part of the light emitted by light-emitting diodes DEL may escape from the lateral edges of handle 42 without having crossed phosphor layer 206. The color of the laterally-escaping light is thus different from the color of the light having crossed phosphor layer 206, which may not be desirable if a light of homogeneous color is desired. For optoelectronic device 215, the light laterally escaping from handle 42 crosses trenches 216 filled with phosphor layer 206. The light escaping from handle 42, through surface 43 or laterally, thus advantageously has a homogeneous color.

Figure 18:
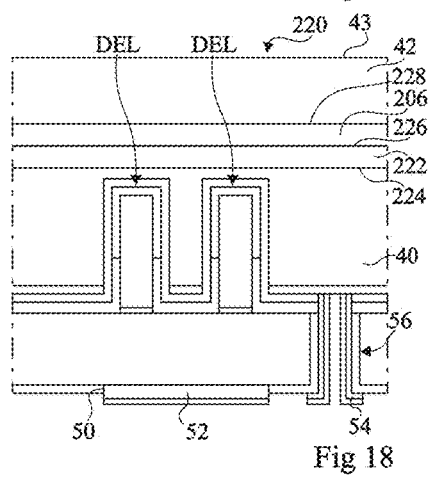

FIG. 18 shows an embodiment of an optoelectronic device 220 comprising all the elements of optoelectronic device 205 shown in FIG. 15, with the difference that glue layer 208 is not shown and that an intermediate layer 222 is interposed between encapsulation layer 40 and phosphor layer 206.

Intermediate layer 222 is capable of letting through the light rays emitted by light-emitting diodes DEL at a first wavelength or in a first wavelength range and of reflecting the light rays emitted by the phosphors at a second wavelength or in a second wavelength range. The extraction ratio of optoelectronic device 220 is then advantageously increased. As an example, intermediate layer 222 may correspond to a dichroic mirror, which is a mirror reflecting light rays having a wavelength within a certain range and letting through light rays having a wavelength which does not belong to this range. A dichroic mirror may be formed of a stack of dielectric layers having different optical indexes.

According to another example, intermediate layer 222 may be a monolayer made of a material having a refractive index smaller than the refractive index of encapsulation layer 40 and smaller than the refractive index of the phosphor layer. Intermediate layer 222 may correspond to a silicone or epoxide polymer layer. Further, a surface treatment, called texturing, is applied to surface 224 of encapsulation layer 40 before the forming of intermediate layer 222 to form raised areas on surface 224. Interface 226 between intermediate layer 222 and phosphor layer 206 is substantially planar. The light rays emitted by light-emitting diodes DEL cross interface 224 which is irregular even if the refractive index of intermediate layer 222 is smaller than the refractive index of encapsulation layer 40 while the light rays emitted by the phosphors mainly reflect on interface 226, given that interface 226 is planar and that the refractive index of intermediate layer 222 is smaller than the refractive index of phosphor layer 206.

A texturing method causing the forming of raised areas at the surface may be applied to free surface 43 of handle 42 and or to surface 228 of phosphor layer 206 in contact with handle 42.

For a layer made of an inorganic material, the method of texturing a surface of the layer may comprise a chemical etching step or a mechanical abrasion step, possibly in the presence of a mask protecting portions of the treated surface in order to promote the forming of raised areas at the surface. For a layer made of an organic material, the method of texturing a surface of the layer may comprise a step of embossing, moulding, etc.

For the previously-described optoelectronic devices, part of the light emitted by light-emitting diodes DEL may escape through the lateral edges of encapsulation layer 40. This is generally not desirable since this light is not perceived by an observer in normal operating conditions of the optoelectronic device. According to an embodiment, the optoelectronic device further comprises means capable of reflecting the light rays laterally escaping from the optoelectronic device to increase the quantity of light escaping from surface 43 of handle 42.

Figure 19:
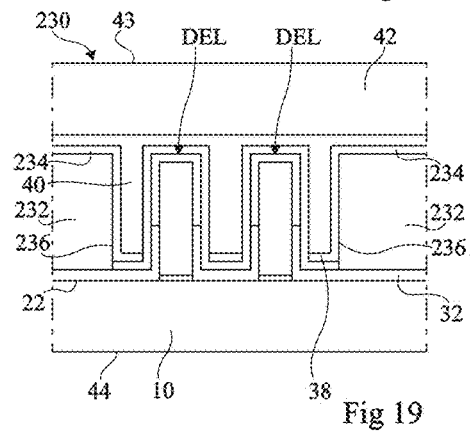

FIG. 19 shows an embodiment of an optoelectronic device 230 comprising all the components of the optoelectronic device shown in FIG. 2F and further comprising blocks 232 arranged on insulating layer 32 and at least partially surrounding the assembly of light-emitting diodes DEL. Each block 232 is covered with a metal layer 234, for example corresponding to an extension of conductive layer 38. As an example, blocks 232 may correspond to resist blocks formed on insulating layer 32 before the deposition of encapsulation layer 40. Preferably, the height of blocks 232 is smaller than the maximum height of encapsulation layer 40. In FIG. 19, lateral edges 236 of blocks 232 are substantially perpendicular to surface 22 of substrate 10. As a variation, lateral sides 236 may be inclined with respect to surface 22 to promote the reflection of light rays towards surface 43 of handle 42.

Figure 20:
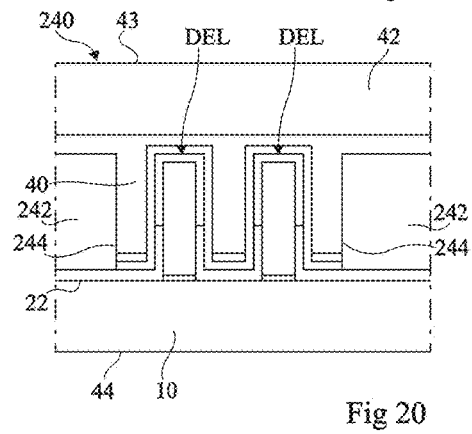

FIG. 20 shows an embodiment of an optoelectronic device 240 comprising all the components of the optoelectronic device shown in FIG. 2F and further comprising blocks 242 arranged on insulating layer 32 and at least partially surrounding the assembly of light-emitting diodes DEL. Blocks 242 are made of a reflective material. It may be silicone filled with reflective particles, for example, titanium oxide particles (TiO2). As an example, blocks 242 may be formed on insulating layer 32 by a silk-screening method before the deposition of encapsulation layer 40. Preferably, the height of blocks 242 is smaller than the maximum height of encapsulation layer 40. In FIG. 20, lateral edges 244 of blocks 242 are substantially perpendicular to surface 22 of substrate 10. As a variation, lateral edges 244 may be inclined with respect to surface 22 to promote the reflection of light rays towards surface 43 of handle 42.

Figure 21:
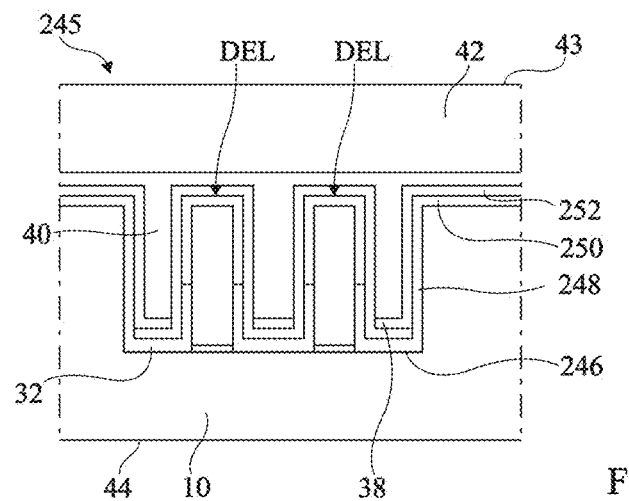

FIG. 21 shows an embodiment of an optoelectronic device 245 comprising all the components of the optoelectronic device shown in FIG. 2F, with the difference that light-emitting diodes DEL are formed in a cavity 246 formed in substrate 10. Lateral sides 248 of cavity 246 are covered with an insulating layer 250, for example corresponding to an extension of insulating layer 32, and with a metal layer 252, for example corresponding to an extension of conductive layer 38. Preferably, the depth of cavity 246 is smaller than the maximum height of encapsulation layer 40. In FIG. 21, lateral sides 248 of the cavity are substantially perpendicular to surface 43 of handle 42. As a variation, lateral sides 248 may be inclined with respect to surface 43 to promote the reflection of light rays towards surface 43 of handle 42.

Figure 22:
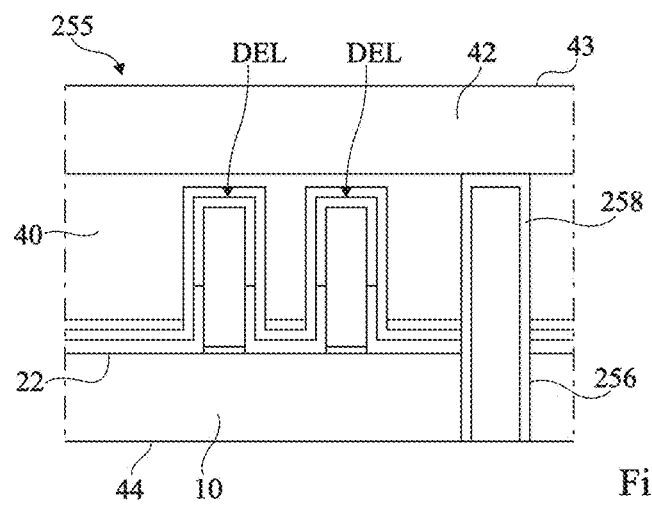

FIG. 22 shows an embodiment of an optoelectronic device 255 comprising all the components of the optoelectronic device shown in FIG. 2F and further comprising trenches 256 surrounding light-emitting diodes DEL, a single trench being shown in FIG. 22. Trenches 256 cross substrate 10 and encapsulation layer 40. The internal walls of each trench 256 are covered with a reflective layer 258, for example, a metal layer, for example, made of silver or aluminum or a varnish layer, having a thickness in the range from 30 nm to 2,000 nm. An insulating layer, not shown, may be provided to insulate reflective layer 258 from substrate 10. Trenches 256 may be formed after the step of thinning substrate 10 previously described in relation with FIG. 2D. An advantage over optoelectronic devices 230, 240, and 245 is that encapsulation layer 40 may be formed on a planar surface, which makes its deposition easier.

Figure 23:
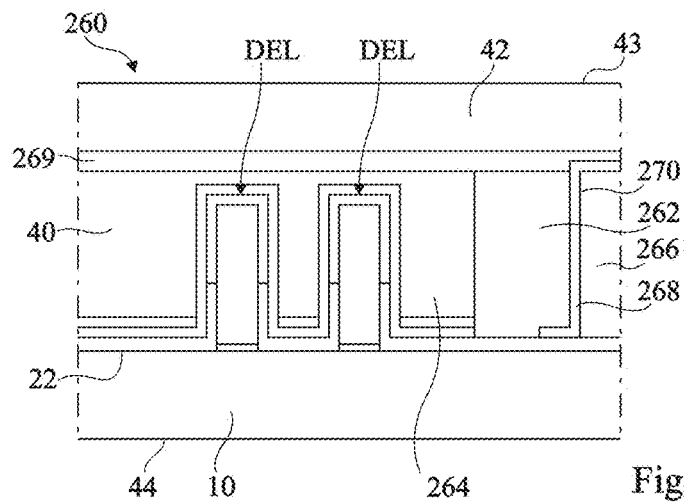

FIG. 23 shows an embodiment of an optoelectronic device 260 comprising all the components of the optoelectronic device shown in FIG. 2F and further comprising trenches 262 formed in encapsulation layer 40 and surrounding light-emitting diodes DEL, a single trench being shown in FIG. 23. Trenches 262 may be filled with air. Trenches 262 may be formed by etching after the step of forming encapsulation layer 40 in the case where encapsulation layer 40 is made of an inorganic material. Trenches 262 delimit, in encapsulation layer 40, a central block 264 having the light-emitting diodes embedded therein and peripheral blocks 266 at least partially surrounding central block 264. Each peripheral block 266 is covered with a metal layer 268, for example, made of silver or aluminum and having a thickness in the range from 30 nm to 2,000 nm. A glue layer 269 may be provided between handle 42 and blocks 264, 266. In FIG. 23, lateral sides 270 of peripheral blocks 266 are substantially perpendicular to surface 22 of substrate 10. As a variation, lateral sides 270 may be inclined with respect to surface 22 to promote the reflection of light rays towards surface 43 of handle 42. An advantage over optoelectronic devices 230, 240, and 245 is that encapsulation layer 40 may be formed on a planar surface, which makes its deposition easier.

Figure 24:
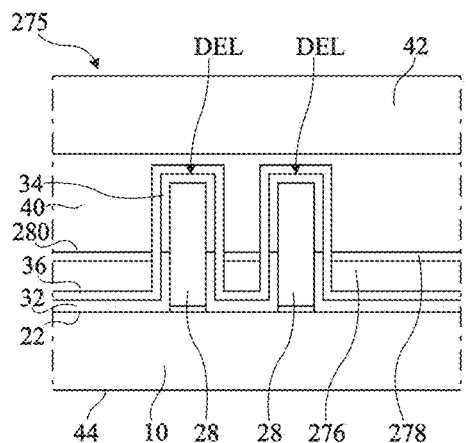

FIG. 24 shows an embodiment of an optoelectronic device 275 comprising all the components of the optoelectronic device shown in FIG. 2F and further comprising an insulating layer 276 extending on electrode layer 32 between light-emitting diodes DEL, without covering light-emitting diodes DEL. Insulating layer 276 is covered with a reflective layer 278. Reflective layer 278 preferably corresponds to a metal layer, for example, made of aluminum, of an aluminum-based alloy, particularly AlSiz, AlxCuy (for example, with x equal to 1 and y equal to 0.8%), of silver, gold, nickel, or palladium. As an example, reflective layer 278 has a thickness in the range between 30 nm and 2,000 nm. Reflective layer 278 may comprise a stack of a plurality of layers, particularly comprising a bonding layer, for example, made of titanium. The thicknesses of insulating layer 276 and of reflective layer 278 are selected to that surface 280 of the reflective layer in contact with encapsulation layer 40 is close to the end of shell 34, for example, less than 1 μm away from the end of shell 34. As compared with the previously-described embodiments, reflective surface 280 advantageously enables to avoid for light rays emitted by shell 34 of a light-emitting diode DEL to the outside of the light-emitting diode to penetrate into lower portion 28 of the light-emitting diode or lower portions 28 of the neighboring light-emitting diodes. The extraction ratio is thus increased.

Figure 25:
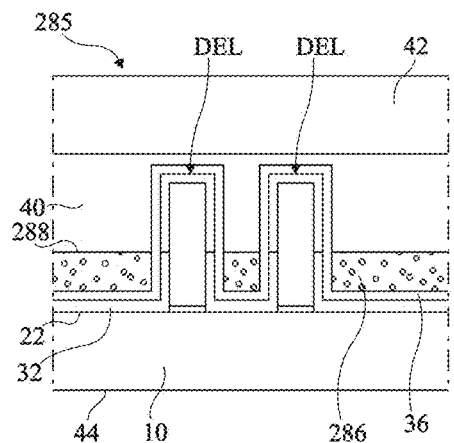

FIG. 25 shows an embodiment of an optoelectronic device 285 comprising all the components of optoelectronic device 275 shown in FIG. 24, with the difference that insulating layer 276 and reflective layer 280 are replaced with a reflective layer 286 extending on electrode layer 32 between light-emitting diodes DEL, without covering light-emitting diodes DEL. It may be a silicone layer filled with reflective particles, for example, TiO2 particles, or a TiO2 layer. The thickness of reflective layer 286 is selected so that surface 288 of reflective layer 286 in contact with encapsulation layer 40 is close to the end of shell 34, for example, less than 1 μm away from the end of shell 34. The extraction ratio is thus increased.

According to an embodiment, one or a plurality of lenses are provided on surface 43 of handle 42. The lenses enable to increase the focusing of light rays escaping from surface 43 along the direction perpendicular to surface 43 and thus to increase the quantity of light rays perceived by a user watching surface 43.

Figure 26:
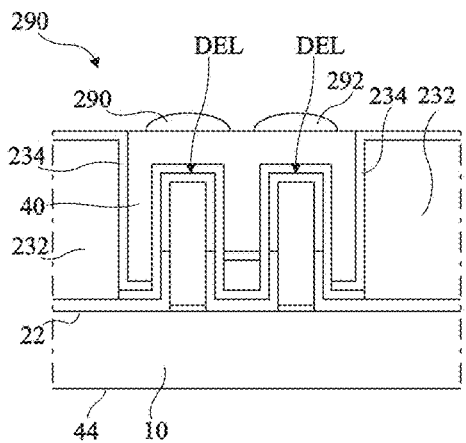

FIG. 26 shows an embodiment of an optoelectronic device 290 comprising all the components of optoelectronic device 230 shown in FIG. 19, with the difference that handle 42 is not present. Further, optoelectronic device 290 comprises, for each light-emitting diode DEL, a converging lens 292 arranged on encapsulation layer 40.

Figure 27:
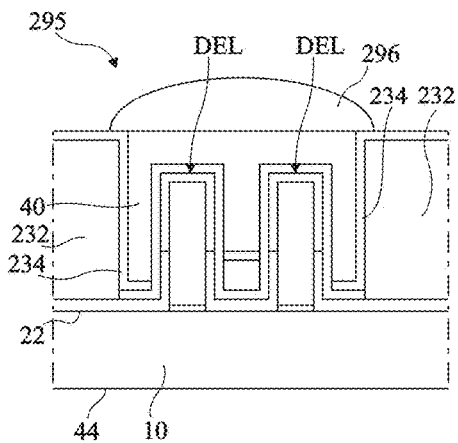

FIG. 27 is a view similar to FIG. 26 of an embodiment 295 where a lens 296 is associated with a plurality of light-emitting diodes DEL.

Specific embodiments of the present invention have been described. Various alterations and modifications will occur to those skilled in the art. Further, although, in the previously-described embodiments, each wire 26 comprises a passivated portion 28 at the base of the wire in contact with one of seed pads 24, passivated portion 28 may be absent.

Further, although embodiments have been described for an optoelectronic device for which shell 34 covers the top of the associated wire 26 and a portion of the lateral sides of wire 26, it is possible to only provide the shell at the top of wire 26.

The invention claimed is:

1. A method of manufacturing optoelectronic devices comprising the steps of:
   (a) providing a substrate having a first surface;
   (b) forming, on the first surface, assemblies of light-emitting diodes comprising, conical or tapered wire-shaped semiconductor elements;
   (c) forming, for each assembly of light-emitting diodes, an electrode layer covering each light-emitting diode of said assembly and a conductive layer covering the electrode layer around the light-emitting diodes of said assembly;
   (d) covering the entire first surface of a layer encapsulating the light-emitting diodes;
   (e) decreasing the substrate thickness, the substrate having, after step (e), a second surface opposite to the first surface;
   (f) forming a conductive element insulated from the substrate and crossing the substrate from the second surface all the way to at least the first surface, the conductive element being in contact with the conductive layer;
   (g) after step (d), forming, on the second surface, at least one first conductive pad in contact with the substrate; and
   (h) after step (d), cutting the obtained structure to separate each assembly of light-emitting diodes.

2. The method of claim 1, comprising, at step (f), forming, on the second surface, at least one second conductive pad in contact with the conductive element.

3. The method of claim 1, comprising forming at least one additional conductive element, insulated from the substrate and crossing the substrate from the second surface all the way to at least the first surface, and in contact with the base of at least one of the light-emitting diodes.

4. The method of claim 1, wherein the forming of the conductive element successively comprises, after step (e), etching an opening in the substrate from the second surface, forming an insulating layer at least on the lateral walls of the opening, and forming a conductive layer covering the insulating layer, or filling the opening with a conductive material.

5. The method of claim 1, wherein step (f) is at least partly carried out before step (b) and comprises, before step (b), etching an opening in the substrate from the first surface across a portion of the substrate thickness, the opening being opened on the second surface at step (e).

6. The method of claim 5, wherein the electrode layer and the conductive layer are further formed in the opening.

7. The method of claim 5, comprising, before step (b), forming an insulating portion at least on the lateral walls of the opening and filling the opening with a conductive material.

8. The method of claim 1, comprising, before step (e), a step of attaching a support to the layer encapsulating the light-emitting diodes.

9. The method of claim 1, wherein the layer encapsulating the light-emitting diodes comprises phosphors between the light-emitting diodes.

10. The method of claim 8, comprising a step of forming a layer of phosphors covering the layer encapsulating the light-emitting diodes or covering the support.

11. The method of claim 10, comprising a step of forming a layer, between the layer encapsulating the light-emitting diodes and the phosphor layer, capable of transmitting the light rays emitted by the light-emitting diodes and of reflecting the light rays emitted by the phosphors.

12. The method of claim 1, comprising a step of forming reflectors around the light-emitting diodes between the substrate and the layer encapsulating the light-emitting diodes and having a height greater by 50% than the height of the light-emitting diodes.

* * * * *